United States Patent
Winterberg et al.

(10) Patent No.: US 11,985,760 B2
(45) Date of Patent: May 14, 2024

(54) REDUCTION OF CROSSTALK AND IMPEDANCE SENSITIVITY FOR A MICROSTRIP IN A PRINTED CIRCUIT BOARD OF AN INFORMATION HANDLING SYSTEM

(71) Applicant: Dell Products L.P., Round Rock, TX (US)

(72) Inventors: Douglas S. Winterberg, Austin, TX (US); Wan-Ju Kuo, Xindian District (TW); Bhyrav M. Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 226 days.

(21) Appl. No.: 17/659,735

(22) Filed: Apr. 19, 2022

(65) Prior Publication Data
US 2023/0337354 A1 Oct. 19, 2023

(51) Int. Cl.
*H05K 1/02* (2006.01)
*H01P 3/08* (2006.01)

(52) U.S. Cl.
CPC ........... *H05K 1/0216* (2013.01); *H01P 3/081* (2013.01); *H05K 1/024* (2013.01)

(58) Field of Classification Search
CPC .............................. H05K 1/0216; H05K 1/024
See application file for complete search history.

(56) References Cited

U.S. PATENT DOCUMENTS

| | | | |
|---|---|---|---|
| 8,344,819 B2 * | 1/2013 | Karikalan | H05K 1/0219 333/33 |
| 9,338,880 B2 * | 5/2016 | Karikalan | H05K 1/0245 |
| 2004/0239438 A1 * | 12/2004 | Benham | H01P 5/185 333/24 R |
| 2008/0048796 A1 * | 2/2008 | Shaul | H01P 3/003 333/4 |
| 2009/0223707 A1 * | 9/2009 | Karikalan | H05K 1/0224 29/831 |
| 2010/0102903 A1 * | 4/2010 | Velayudham Karikalan | H05K 1/02 29/846 |

* cited by examiner

*Primary Examiner* — Sherman Ng
(74) *Attorney, Agent, or Firm* — McDermott Will & Emery LLP

(57) ABSTRACT

A printed circuit board (PCB), including: a ground reference layer; a pre-impregnated (pre-preg) layer having a surface; a first transmission line positioned on the surface; a second transmission line positioned on the surface spaced-apart from the first transmission line a first distance; and a solder mask layer positioned on the surface of the pre-preg layer and surrounding the first transmission line and the second transmission line, the solder mask layer having a thickness and a dielectric constant, wherein the thickness of the solder mask layer and a value of the dielectric constant of the solder mask layer cause convergence of electric fields associated with the first transmission line to be within a second distance from the first transmission line.

12 Claims, 4 Drawing Sheets

REDUCTION OF CROSSTALK AND IMPEDANCE SENSITIVITY FOR A MICROSTRIP IN A PRINTED CIRCUIT BOARD OF AN INFORMATION HANDLING SYSTEM

BACKGROUND

Field of the Disclosure

The disclosure relates generally to an information handling system, and in particular, reduction of crosstalk and impedance sensitivity for a microstrip in a printed circuit board of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

With double data rate (DDR) memory speeds approaching Peripheral Component Interconnect Express (PCIe) speeds (6.4 to 6 Gbps), reflections and crosstalk are becoming more important than ever. Increasing in the number of DDR channels is also making DDR routing very challenging, including impedance mismatches and signal integrity degradation issues.

SUMMARY

Innovative aspects of the subject matter described in this specification may be embodied in a printed circuit board (PCB), including: a ground reference layer; a pre-impregnated (pre-preg) layer having a surface; a first transmission line positioned on the surface; a second transmission line positioned on the surface spaced-apart from the first transmission line a first distance; and a solder mask layer positioned on the surface of the pre-preg layer and surrounding the first transmission line and the second transmission line, the solder mask layer having a thickness and a dielectric constant, wherein the thickness of the solder mask layer and a value of the dielectric constant of the solder mask layer cause convergence of electric fields associated with the first transmission line to be within a second distance from the first transmission line.

Other embodiments of these aspects include corresponding systems and apparatus.

These and other embodiments may each optionally include one or more of the following features. For instance, the second distance is less than the first distance. The thickness of the solder mask layer and the value of the dielectric constant of the solder mask layer cause convergence of the electric fields to the ground reference layer. The pre-preg layer is positioned between the solder mask layer and the ground reference layer. The thickness of the solder mask layer is between 2-4 thousandths of an inch (mils). The value of the dielectric constant is between 4-8. The first transmission line and the second transmission line are microstrip traces.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
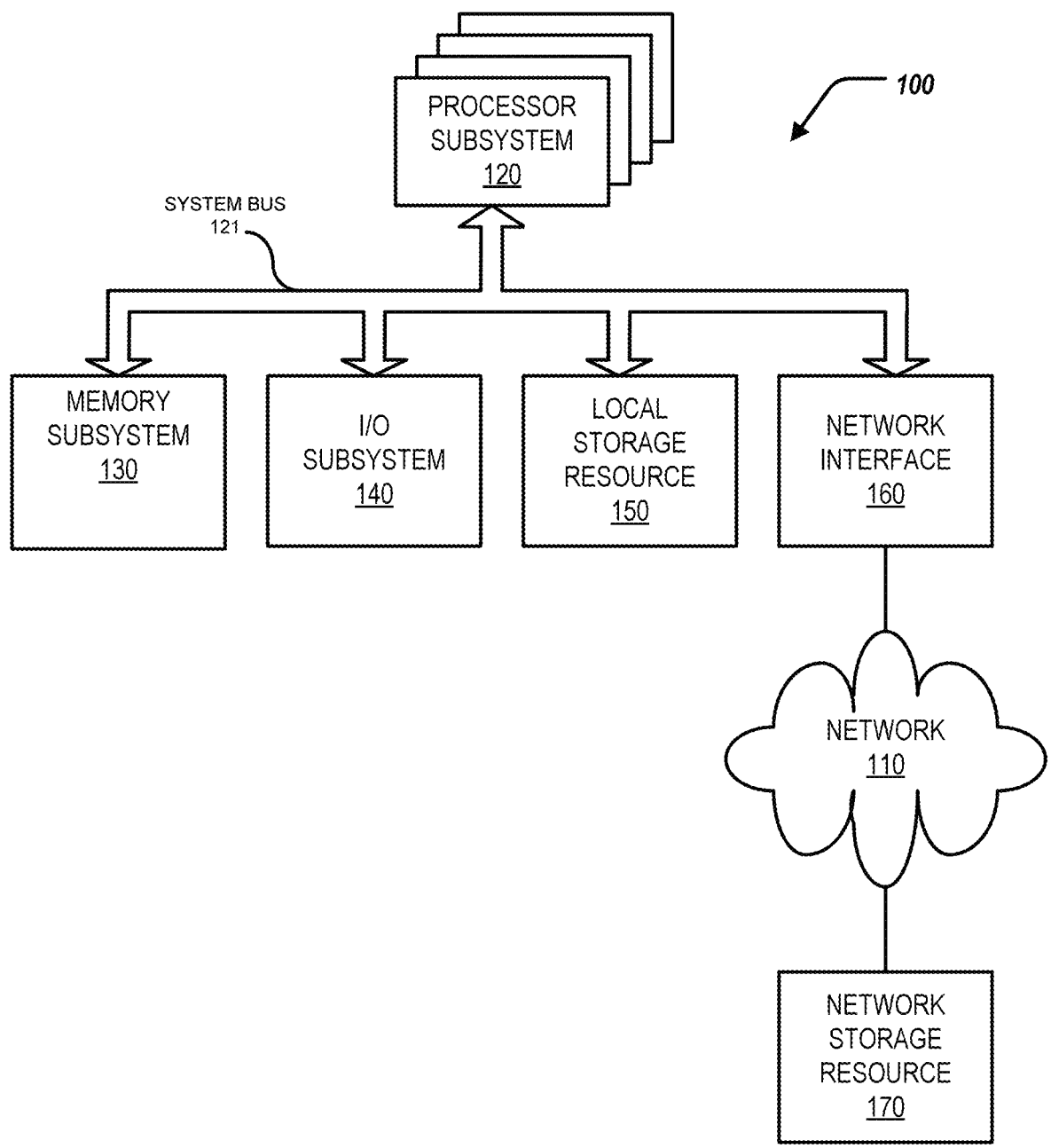
FIG. 1 is a block diagram of selected elements of an embodiment of an information handling system.

This disclosure discusses reduction of crosstalk and impedance sensitivity for a microstrip in a printed circuit board of an information handling system. In short, printed circuit boards (PCB) of the information handling system can include traces for signals to transverse down. To reduce crosstalk between the traces, a thickness of a solder mask layer can be increased, and the value of the dielectric constant of the solder mask layer can be selected to reduce such crosstalk.

Specifically, this disclosure discusses a printed circuit board including a ground reference layer; a pre-impregnated (pre-preg) layer having a surface; a first transmission line positioned on the surface; a second transmission line positioned on the surface spaced-apart from the first transmission line a first distance; and a solder mask layer positioned on the surface of the pre-preg layer and surrounding the first transmission line and the second transmission line, the solder mask layer having a thickness and a dielectric constant, wherein the thickness of the solder mask layer and a value of the dielectric constant of the solder mask layer cause convergence of electric fields associated with the first transmission line to be within a second distance from the first transmission line.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-4 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

In short, printed circuit boards (PCB) of the information handling system 100 can include traces for signals to transverse down. To reduce crosstalk between the traces, a thickness of a solder mask layer can be increased, and the value of the dielectric constant of the solder mask layer can be selected to reduce such crosstalk.

Figure 2:
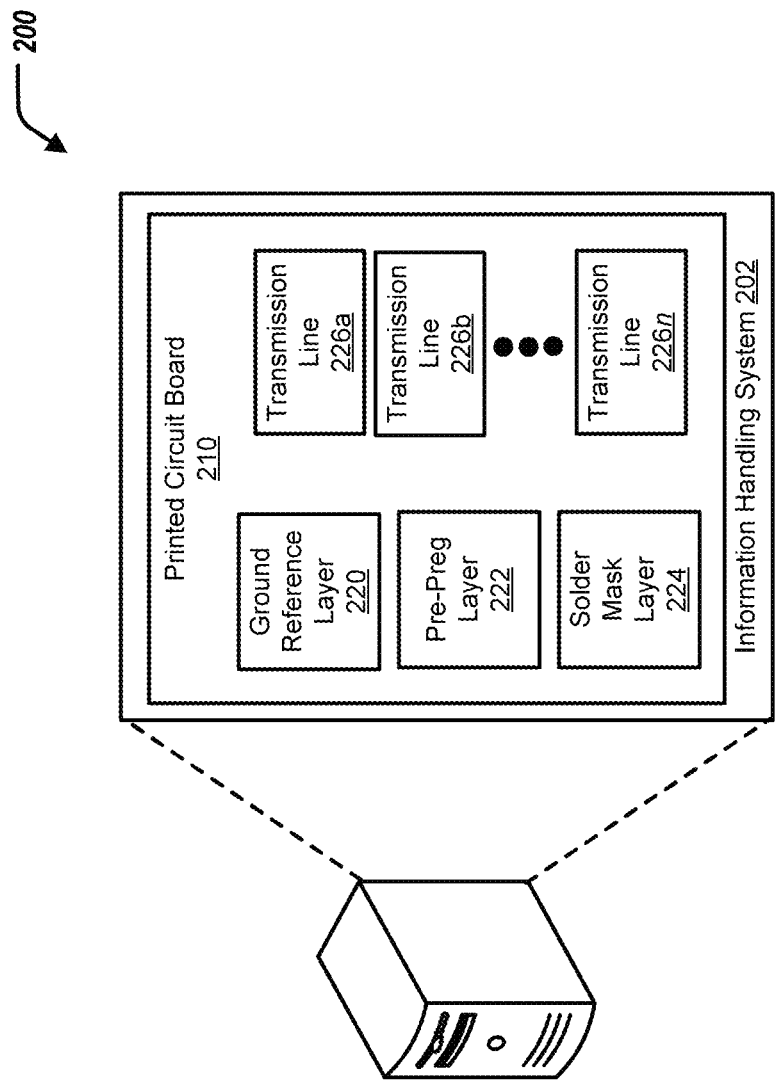
FIG. 2 illustrates a block diagram of an information handling system for including a printed circuit board.

Turning to FIG. 2, FIG. 2 illustrates an environment 200 including an information handling system 202. The information handling system 202 can include a printed circuit board (PCB) 210. In some examples, the information handling system 202 is similar to, or includes, the information handling system 100 of FIG. 1.

Figure 3:
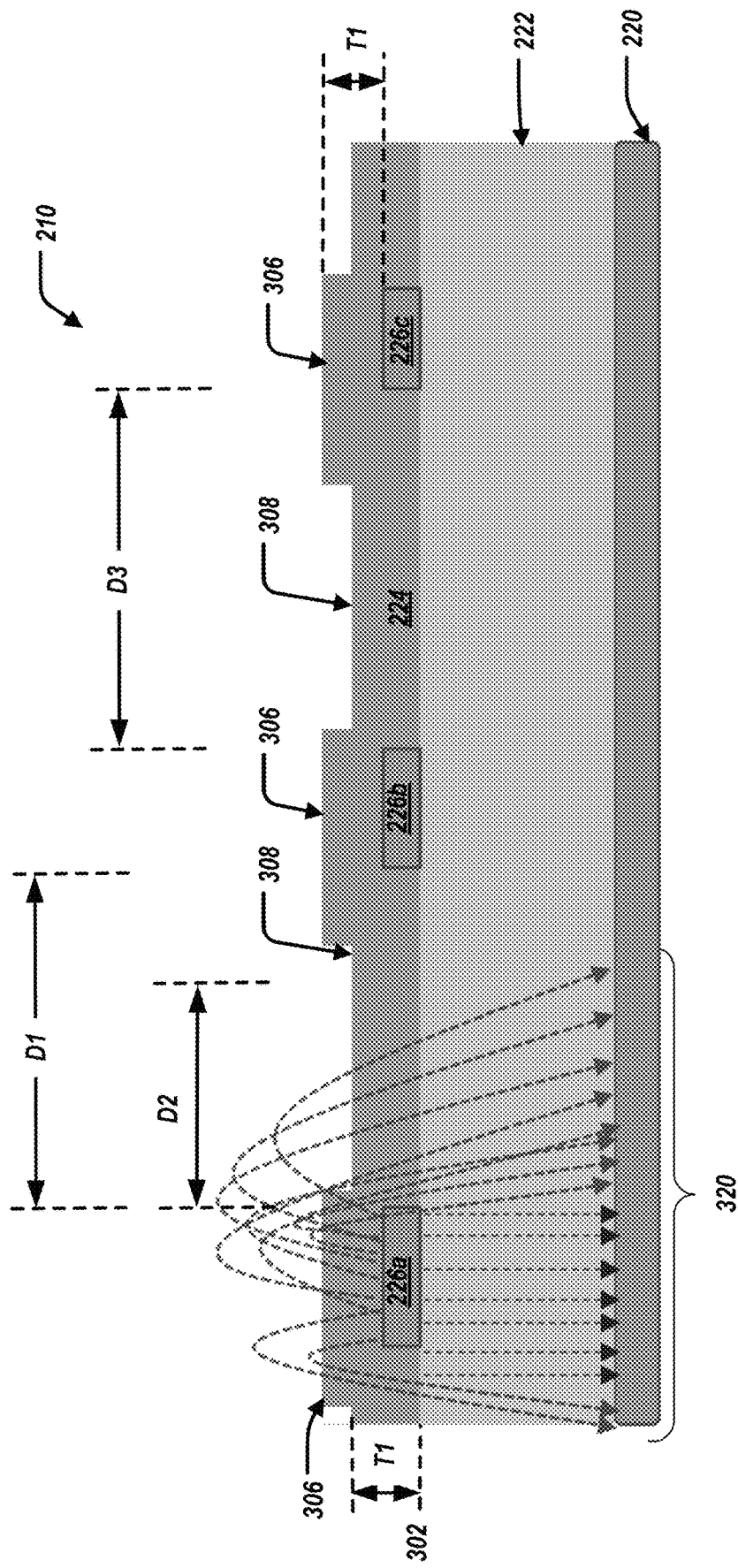
FIGS. 3 and 4 illustrate respective side cut-away views of the printed circuit board.
Figure 4:
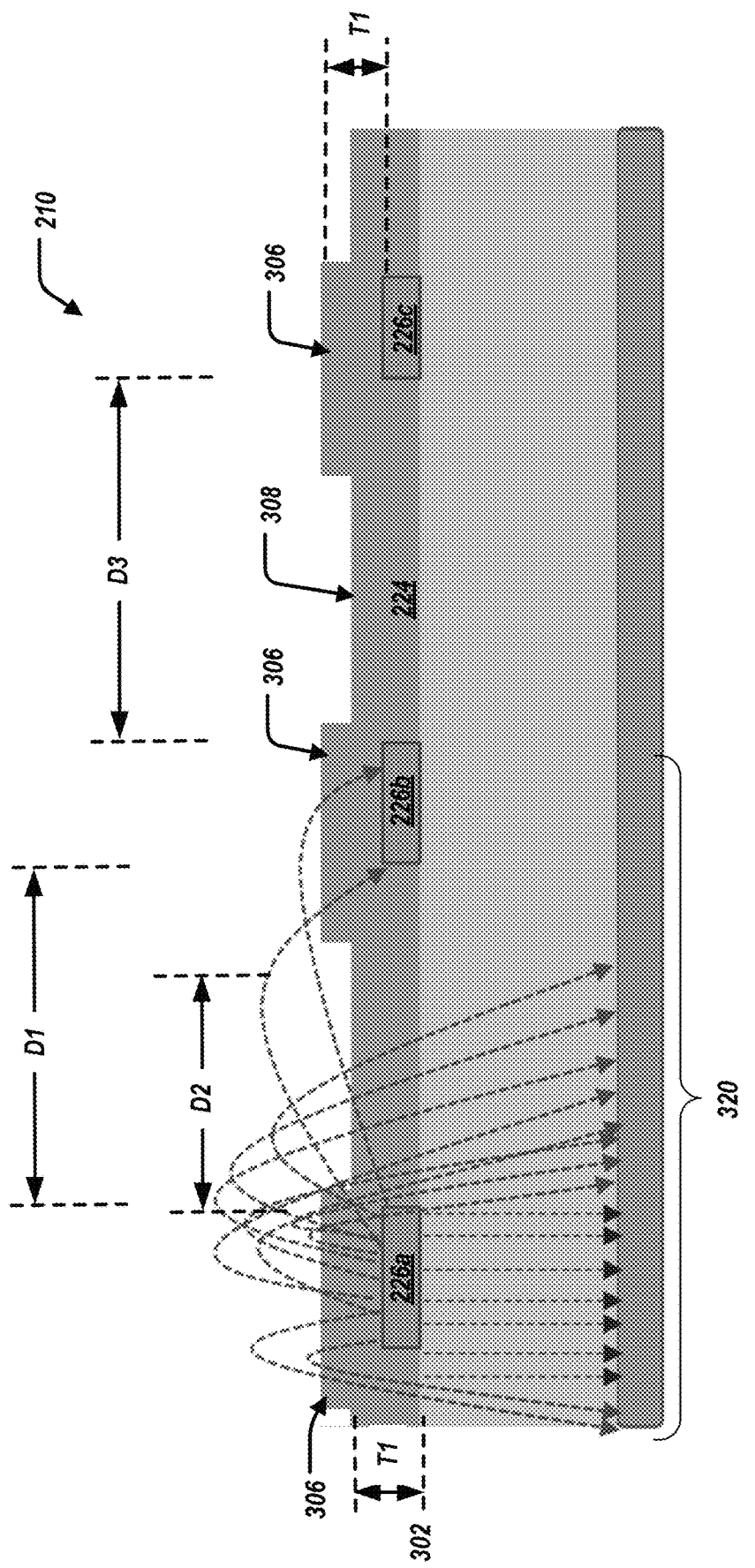

As discussed further with respect to FIGS. 3 and 4, the PCB 210 can include a ground reference layer 220, a pre-preg layer 222, a solder mask layer 224, and transmission lines 226a, 226b, . . . , 226n (collectively referred to as transmission lines 226).

FIG. 3 illustrates a side cut-away view of the PCB 210. Specifically, the PCB 210 can include the ground reference layer 220, the pre-preg (pre-impregnated) layer 222, the solder mask layer 224, a first transmission line 226a, a second transmission line 226b, and a third transmission line 226c. The pre-preg layer 222 can include fiberglass impregnated with resin, and functions to couple the ground reference layer 220 with the solder mask layer 224 and/or the transmission lines 226.

The pre-preg layer 222 is positioned between the solder mask layer 224 and the ground reference layer 220. The pre-preg layer 222 can have a surface 302.

The solder mask layer 224 can function as an insulating layer between the transmission lines 226.

The transmission lines 226 can be positioned on the surface 302 of the pre-preg layer 222. The transmission lines 226 can be microstrip traces that are routed on an external layer of the PCB 210 (e.g., the pre-preg layer 222) and have only one reference plane. The second transmission line 226b can be spaced-apart from the first transmission line 226a a first distance D1. The third transmission line 226c can be spaced-apart from the second transmission line 226b a third distance D3. In some examples, the first distance D1 and/or the third distance D3 is between 4 thousandths of an inch (mils) and 30 thousandths of an inch (mils).

The solder mask layer 224 is positioned on the surface 302 of the pre-preg layer 222 and surrounds the transmission line 226. The solder mask layer 224 can have a thickness T1 defined between the transmission line 226 and protrusions 306 of the solder mask layer 224. Further, the thickness T1 can also between the surface 302 of the pre-preg layer 222 and the recessions 308 of the solder mask layer 224. In some examples, the thickness T1 of the solder mask layer 224 is between 2-4 thousandths of an inch (mils). The solder mask layer 224 can be associated with a dielectric constant. In some examples, the value of the dielectric constant of the solder mask layer 224 is between 4-8. In some examples, the solder mask layer 224 can be formed from epoxy liquid, liquid photoimageable, dry film photoimageable, top-side masks, and bottom-side masks.

As signals transverse the transmission line 226a, electric fields 320 can be generated that are associated with the first transmission line 226a and the signal that is traveling down the transmission line 226a. The electric fields 320 can originate at the first transmission line 226a and radiate outwards from the first transmission line 226a. To that end, the thickness T1 of the solder mask layer 224 and the value of the dielectric constant of the solder mask layer 224 can facilitate convergence of the electric fields 320 associated with the first transmission line 226a to be within a second distance D2 from the first transmission line 226a. Specifically, the thickness T1 of the solder mask layer 224 and the value of the dielectric constant of the solder mask layer 224 keeps (or maintains) the electric fields 220 closer to the first transmission line 226a such that the electric fields 320 are not incident upon the second transmission line 226b (the second transmission line 226b does not experience effects of the electric fields 220). That is, the thickness T1 of the solder mask layer 224 and the value of the dielectric constant of the solder mask layer 224 facilitate encasing the electric fields 220 within the physical range of the second distance D2. In other words, the value of the dielectric constant of the solder mask layer 224 facilitates a concentration of the electric fields 220 such that the electric fields 220 converge to the ground reference layer 220 (as opposed to converging to the second transmission line 226b). In some cases, the thickness T1 of the solder mask layer 224 and the value of the dielectric constant of the solder mask layer 224 facilitate convergence of the electric fields 320 to the ground reference layer 220.

In some examples, a physical size of the transmission lines 226 can facilitate reducing crosstalk between the transmission lines 226. That is, a width of the physical size of the transmission lines 226 can be reduced to reduce crosstalk between the transmission lines 226, and facilitate convergence of the electric fields 320 to be within the second distance D2 from the first transmission line 226a and to the ground reference layer 220.

In some examples, a physical distance between the surface 302 of the pre-preg layer 222 and the ground reference layer 220 can facilitate reducing a sensitivity of impedance of the pre-preg layer 222. That is, the physical distance between the surface 302 of the pre-preg layer 222 and the ground reference layer 220 can facilitate convergence of the electric fields 320 to be within the second distance D2 from the first transmission line 226a and to the ground reference layer 220.

In some examples, the second distance D2 is less than the first distance D1. That is, the distance D2 that the electric fields 320 are confined within from the first transmission line 226a is less than the first distance D1 between the second transmission line 226b and the first transmission line 226a. Thus, the electric fields 320 are not incident upon the second transmission line 226b (the second transmission line 226b does not experience effects of the electric fields 220).

Referring to FIG. 4, in some examples, a minority of the electric fields 220 can be incident upon the second transmission line 226b. However, a majority of the electric fields 320 are not incident upon the second transmission line 226b (the second transmission line 226b does not experience effects of the electric fields 220). That is, the thickness T1 of the solder mask layer 224 and the value of the dielectric constant of the solder mask layer 224 can facilitate convergence of a majority of the electric fields 320 associated with the first transmission line 226a to be within the second distance D2 from the first transmission line 226a. Specifically, the thickness T1 of the solder mask layer 224 and the value of the dielectric constant of the solder mask layer 224 keeps (or maintains) the electric fields 220 closer to the first transmission line 226a such that a majority of the electric fields 320 are not incident upon the second transmission line 226b (the second transmission line 226b only experiences effects of a minority of the electric fields 220). That is, the thickness T1 of the solder mask layer 224 and the value of the dielectric constant of the solder mask layer 224 facilitate encasing a majority of the electric fields 220 within the physical range of the second distance D2. In other words, the value of the dielectric constant of the solder mask layer 224 facilitates a concentration of the electric fields 220 such that a majority of the electric fields 220 converge to the ground reference layer 220 (as opposed to the second transmission line 226b). In some cases, the thickness T1 of the solder mask layer 224 and the value of the dielectric constant of the solder mask layer 224 facilitate convergence of a majority of the electric fields 320 to the ground reference layer 220.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A printed circuit board (PCB), including:
   a ground reference layer;
   a pre-impregnated (pre-preg) layer having a surface;
   a first transmission line positioned on the surface;
   a second transmission line positioned on the surface spaced-apart from the first transmission line a first distance; and
   a solder mask layer positioned on the surface of the pre-preg layer and surrounding the first transmission line and the second transmission line, the solder mask layer having a thickness and a dielectric constant,
   wherein the thickness of the solder mask layer and a value of the dielectric constant of the solder mask layer cause convergence of electric fields associated with the first transmission line to be within a second distance, less than the first distance, from the first transmission line such that none of the electric fields are incident upon the second transmission line and the second transmission line does not experience the effects of the electric fields.

2. The PCB of claim 1, wherein the thickness of the solder mask layer and the value of the dielectric constant of the solder mask layer cause convergence of the electric fields to the ground reference layer.

3. The PCB of claim 1, wherein the pre-preg layer is positioned between the solder mask layer and the ground reference layer.

4. The PCB of claim 1, wherein the thickness of the solder mask layer is between 2-4 thousandths of an inch (mils).

5. The PCB of claim 1, wherein the value of the dielectric constant is between 4-8.

6. The PCB of claim 1, wherein the first transmission line and the second transmission line are microstrip traces.

7. An information handling system, including:
   a processor;
   memory media storing instructions executable by the processor to perform operations;
   a printed circuit board (PCB), including:
      a ground reference layer;
      a pre-impregnated (pre-preg) layer having a surface;
      a first transmission line positioned on the surface;
      a second transmission line positioned on the surface spaced-apart from the first transmission line a first distance; and
      a solder mask layer positioned on the surface of the pre-preg layer and surrounding the first transmission line and the second transmission line, the solder mask layer having a thickness and a dielectric constant, wherein the thickness of the solder mask layer and a value of the dielectric constant of the solder mask layer cause convergence of electric fields associated with the first transmission line to be within a second distance, less than the first distance, from the first transmission line such that none of the electric fields are incident upon the second transmission line and the second transmission line does not experience the effects of the electric fields.

8. The information handling system of claim 7, wherein the thickness of the solder mask layer and the value of the dielectric constant of the solder mask layer cause convergence of the electric fields to the ground reference layer.

9. The information handling system of claim 7, wherein the pre-preg layer is positioned between the solder mask layer and the ground reference layer.

10. The information handling system of claim 7, wherein the thickness of the solder mask layer is between 2-4 thousandths of an inch (mils).

11. The information handling system of claim 7, wherein the value of the dielectric constant is between 4-8.

12. The information handling system of claim 7, wherein the first transmission line and the second transmission line are microstrip traces.

\* \* \* \* \*